(12) United States Patent
Chen et al.

(10) Patent No.: US 8,967,744 B2
(45) Date of Patent: Mar. 3, 2015

(54) REINFORCEMENT DEVICE FOR SLIDE ASSEMBLY

(75) Inventors: Ken-Ching Chen, Kaohsiung (TW); Chien-Li Huang, Kaohsiung (TW); Chun-Chiang Wang, Kaohsiung (TW)

(73) Assignee: King Slide Works Co., Ltd., Kaohsiung (TW)

( * ) Notice: Subject to any disclaimer, the term of this patent is extended or adjusted under 35 U.S.C. 154(b) by 300 days.

(21) Appl. No.: 13/220,955

(22) Filed: Aug. 30, 2011

(65) Prior Publication Data
US 2012/0087605 A1 Apr. 12, 2012

(30) Foreign Application Priority Data
Oct. 11, 2010 (TW) .............................. 99134832 A (51) Int. Cl.
A47B 88/04 (2006.01)
H05K 7/14 (2006.01)
A47B 88/08 (2006.01)
A47B 88/12 (2006.01)

(52) U.S. Cl.
CPC .............. *H05K 7/1489* (2013.01); *A47B 88/08* (2013.01); *A47B 88/12* (2013.01)
USPC ......................................... 312/334.4; 211/26

(58) Field of Classification Search
CPC .... A47B 88/04; A47B 88/08; A47B 88/0418; A47B 88/0422; A47B 2210/0059; H05K 7/183; H05K 7/186
USPC .......... 312/334.1, 334.4, 334.7, 334.8, 265.1; 211/26, 175, 183, 187, 190, 191; 248/200.1, 220.21, 220.22, 218.4
See application file for complete search history.

(56) References Cited

U.S. PATENT DOCUMENTS

| 6,230,903 | B1 * | 5/2001 | Abbott ........................... 211/26 |
| 6,578,939 | B1 | 6/2003 | Mayer |
| 6,863,188 | B2 * | 3/2005 | Besserer et al. .............. 211/183 |
| 2001/0040142 | A1 * | 11/2001 | Haney ........................... 211/183 |
| 2002/0074914 | A1 * | 6/2002 | Shih .......................... 312/334.4 |
| 2003/0205539 | A1 * | 11/2003 | Lauchner et al. ............... 211/26 |
| 2004/0020874 | A1 * | 2/2004 | Haney ............................. 211/26 |
| 2004/0217073 | A1 * | 11/2004 | Dobler et al. ................... 211/26 |
| 2006/0152115 | A1 | 7/2006 | Dubon et al. |
| 2006/0157436 | A1 * | 7/2006 | Iwamoto ...................... 211/191 |
| 2010/0282932 | A1 * | 11/2010 | Ong et al. ................... 248/206.5 |

* cited by examiner

*Primary Examiner* — James O Hansen
(74) *Attorney, Agent, or Firm* — Rosenberg, Klein & Lee (57) ABSTRACT

A reinforcement device includes a rail, a reinforcement member and an extension support which is connected to the reinforcement member. The rail has a top wall, a bottom wall and a sidewall connected between the top and bottom walls. The sidewall has a first face and a second face which is located opposite to the first face. A space between the top wall, the bottom wall and the first face of the sidewall defines a slide path. The reinforcement member is connected to the reinforcement path of the rail. The extension support is engaged with the rail. The rail is reinforced by the reinforcement member and the extension support.

7 Claims, 8 Drawing Sheets

FIG. 9

REINFORCEMENT DEVICE FOR SLIDE ASSEMBLY

FIELD OF THE INVENTION

The present invention relates to a reinforcement device, and more particularly, to a reinforcement device for reinforcing the rails and minimizing the width of the slide assembly.

BACKGROUND OF THE INVENTION

U.S. Pat. No. 6,578,939 to Mayer discloses a "Universal sliding rail assembly for rack mounting computers" and comprises a slide assembly including an outer rail 102, an intermediate rail 104 slidably connected to the outer rail 102, an inner rail 106 slidably connected to the intermediate rail 104, and a bracket 20 movably connected to the outer rail 102. However, the disclosure lacks a reinforcement device for the slide assembly.

U.S. 2006/0152115 to Dubon discloses an "Adjustable reinforcing bracket for telescoping slide rail assembly" and the slide rail assembly comprises a stationary slide rail 22 which has a wall with an outer surface and the two ends of the stationary slide rail are connected to two posts of a rack by two respective mounting elements 26, 40. The slide rail assembly comprises a reinforcing element 32 connected to the outer surface of the stationary slide rail and a mounting slide rail 34 is slidably connected to the reinforcing element.

However, the reinforcing element 32 is connected to the mounting slide rail 34 and is fixed to the stationary rail 22 so that the width is increased. When the slide assembly is connected to a rack, the rack has a limited space therein so that the slide assembly having such width may not able to be installed to the rack.

The present invention intends to provide a reinforcement device to improve the shortcomings of the existed embodiment.

SUMMARY OF THE INVENTION

The present invention relates to a reinforcement device and comprises a rail having a top wall, a bottom wall located corresponding to the top wall, and a sidewall connected between the top wall and the bottom wall. The sidewall has a first face and a second face which is located opposite to the first face. A space between the top wall, the bottom wall and the first face of the sidewall defines a slide path. The second face of the sidewall defines a recessed reinforcement path which extends along the rail. The reinforcement path has a first inner wall and a second inner wall which is located corresponding to the first inner wall, and a connection wall connected between the first and second inner walls. The connection wall is lower than the surface of the second face so that the reinforcement path has a depth. A reinforcement member is connected in the reinforcement path of the rail. An extension support is connected to the reinforcement member and has a first flange, a second flange located corresponding to the first flange, and a first connection portion connected between the first flange and the second flange. The first flange, the second flange and the first connection portion define an arm. The first flange and the second flange hold the top wall and the bottom wall of the rail.

Preferably, the thickness of the reinforcement member is the same as the depth of the reinforcement path.

Preferably, a top protrusion extends from the second face which is located adjacent to the first inner wall. The top protrusion reaches into the reinforcement path. A lower protrusion extends from the second face located adjacent to the second inner wall. The lower protrusion reaches into the reinforcement path. The reinforcement member contacts the top and lower protrusions so that the reinforcement member is movably connected to the reinforcement path of the rail.

Preferably, the extension support is fixed to the reinforcement member which is movably connected to the reinforcement path of the rail.

Preferably, the extension support is fixed to the reinforcement member which is fixed to the reinforcement path of the rail.

Preferably, the reinforcement member is fixed to the reinforcement path of the rail and the extension support is movably connected to the reinforcement member.

Preferably, the extension support has a longitudinal slot and at least one positioning member which extends through the longitudinal slot and is connected to the reinforcement member. The extension support has an installation portion connected to an end thereof.

Preferably, an installation support is movably connected to the extension support and has an installation portion at an end thereof. The installation support has a first support portion, a second support portion located corresponding to the first support portion, and a second connection portion connected between the first support portion and the second support portion. The first support portion contacts the first flange, and the second support portion contacts the second flange. The second connection portion has two separated longitudinal slots and at least two positioning members which extend through the two longitudinal slots and are connected to the extension support.

The primary object of the present invention is to provide a reinforcement device for a slide assembly and the device reinforces the rails of the slide assembly having limited width.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
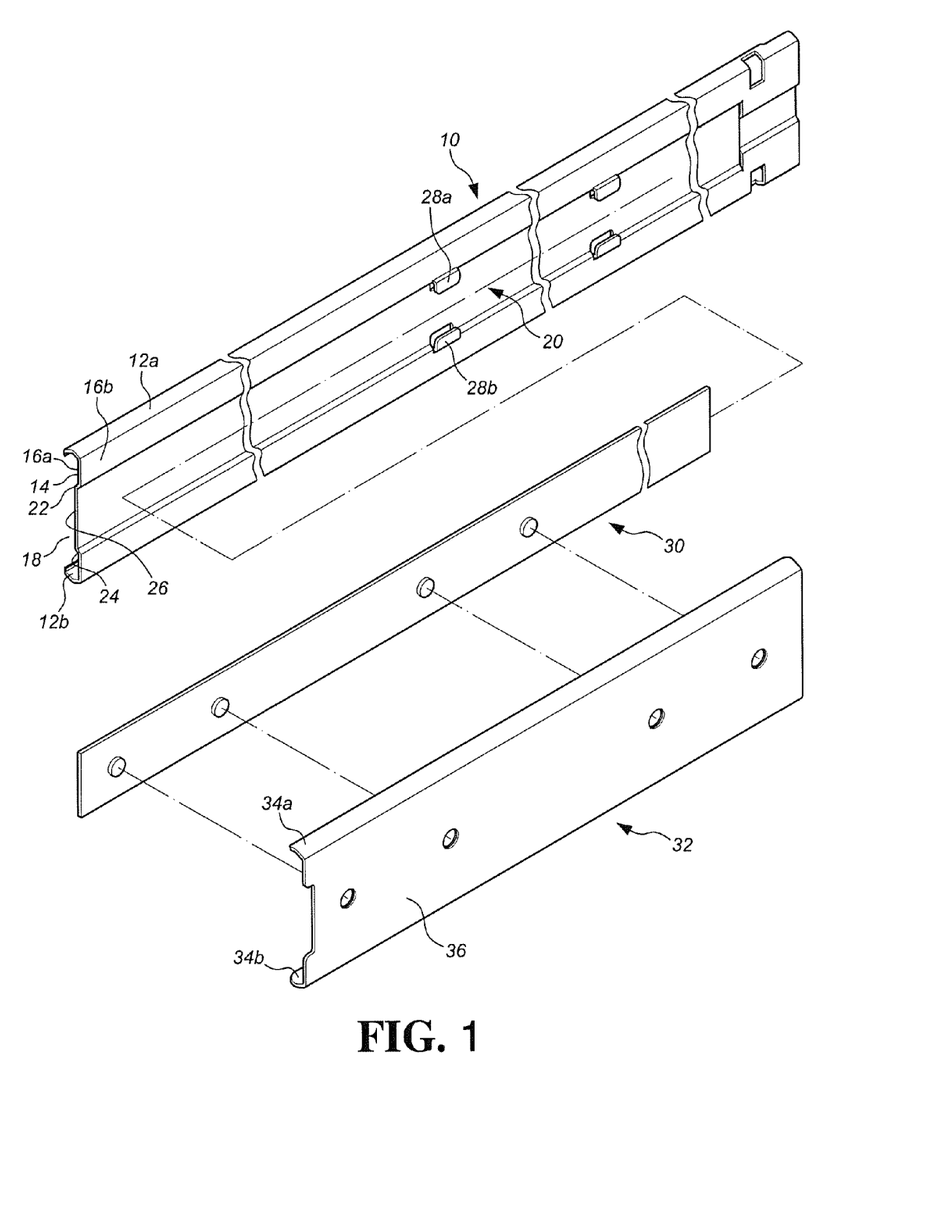
FIG. 1 is an exploded view to show the reinforcement device of the first embodiment of the present invention.
Figure 2:
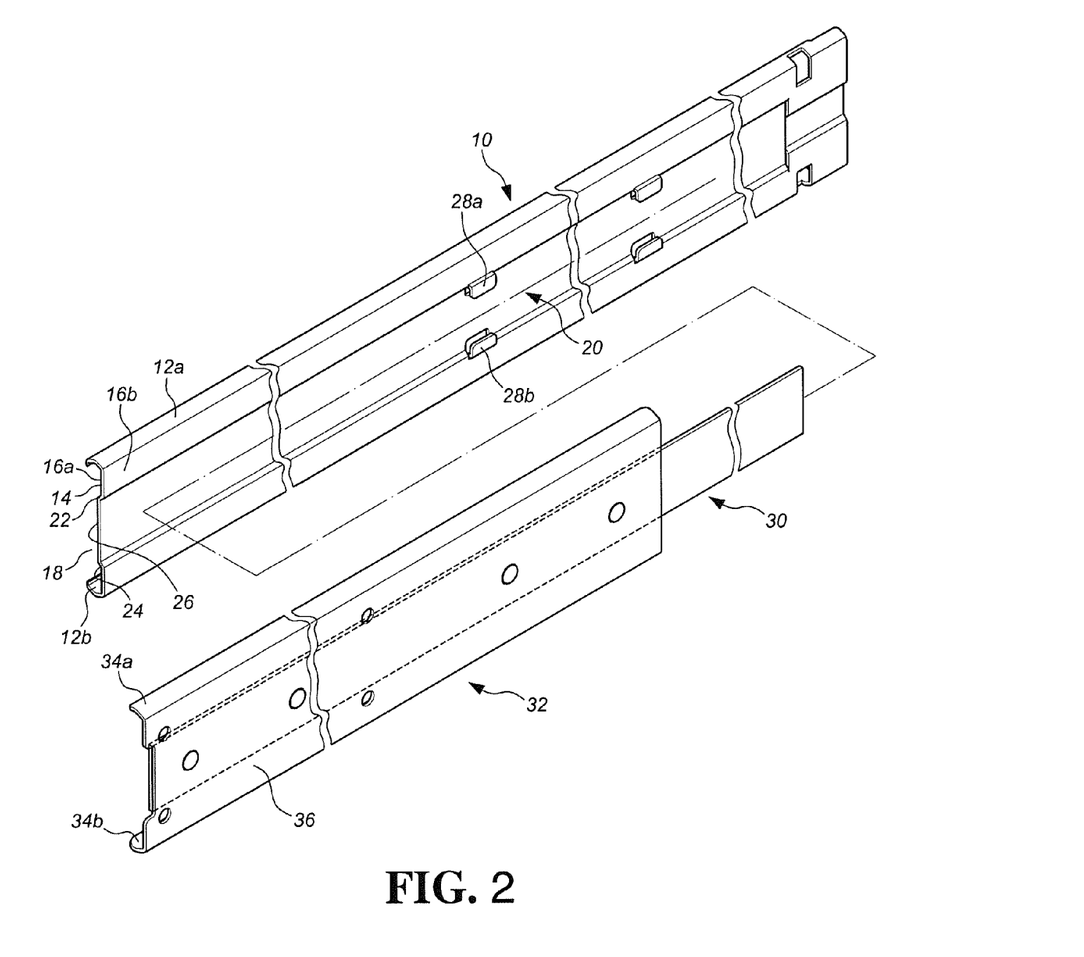
FIG. 2 is an exploded view to show the combination of the reinforcement member and the extension support, and the rail of the slide assembly of the first embodiment of the present invention.

Referring to FIGS. 1 and 2, the reinforcement device of a first embodiment of the present invention comprises a rail 10 having a top wall 12a, a bottom wall 12b located corresponding to the top wall 12a, and a sidewall 14 which is connected between the top wall 12a and the bottom wall 12b. The sidewall 14 has a first face 16a and a second face 16b which is located opposite to the first face 16a. A space between the top wall 12a, the bottom wall 12b and the first face 16a of the sidewall 14 defines a slide path 18. The second face 16b of the sidewall 14 defines a recessed reinforcement path 20. The reinforcement path 20 has a first inner wall 22 and a second inner wall 24 located corresponding to the first inner wall 22, and a connection wall 26 connected between the first and second inner walls 22, 24. The connection wall 26 is lower than the surface of the second face 16b so that the reinforcement path 20 has a depth. Preferably, the reinforcement path 20 extends along the longitudinal direction of the rail 10 and the bent portions of the reinforcement path 20 reinforce the structure of the rail 10 and form an accommodation space. Preferably, a top protrusion 28a extends from the second face 16b which is located adjacent to the first inner wall 22. The top protrusion 28a reaches into the reinforcement path 20. A lower protrusion 28b extends from the second face 16b which is located adjacent to the second inner wall 24. The lower protrusion 28b reaches into the reinforcement path 20. Preferably, the top protrusions 28a and the lower protrusions 28b are multiple in numbers and located on the rail 10.

Figures 3, 4:
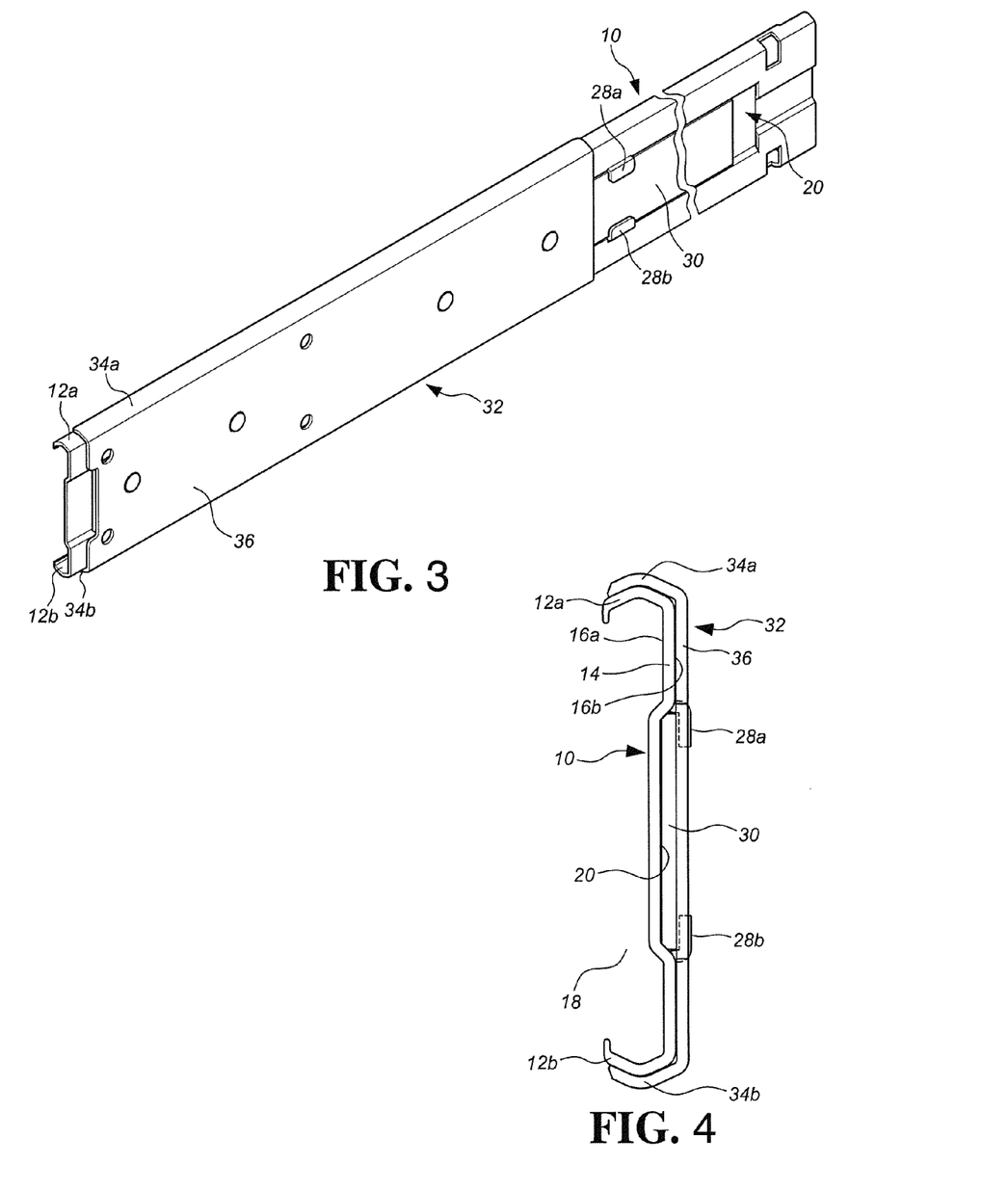
FIG. 3 is a perspective view to show the connection of the reinforcement member, the extension support and the rail of the slide assembly of the first embodiment of the present invention.
FIG. 4 is a cross sectional view to show that the reinforcement member and the extension support are connected to the rail of the first embodiment of the present invention.

In a preferred embodiment of the present, an extension support 32 is fixed to a reinforcement member 30. As shown in FIGS. 3 and 4, the reinforcement member 30 is connected to the reinforcement path 20 of the second face 16b of the sidewall 14 of the rail 10. The reinforcement path 20 and the reinforcement member 30 reinforce the structure of the rail 10. Preferably, the thickness of the reinforcement member 30 is the same as the depth of the reinforcement path 20. Therefore, the second face 16b of the sidewall 14 of the rail 10 does not expand its width and rather narrows the width. In this embodiment, the reinforcement member 30 is movably connected to the reinforcement path 20. The reinforcement member 30 contacts the top and lower protrusions 28a, 28b, so that the reinforcement member 30 is movably connected to the reinforcement path 20 of the rail 10. The rail 10 is therefore adjusted. Furthermore, the extension support 32 has a first flange 34a, a second flange 34b located corresponding to the first flange 34a, and a first connection portion 36 connected between the first flange 34a and the second flange 34b. The first flange 34a, the second flange 34b and the first connection portion 36 define an arm. The first connection portion 36 of the extension support 32 is connected to the reinforcement member 30 by rivets, and the first flange 34a and the second flange 34b hold the top wall 12a and the bottom wall 12b of the rail 10. Therefore, the reinforcement member 30 and the extension support 32 are able to move together relative to the rail 10. Furthermore, the width of the whole assembly including the extension support 32, the reinforcement member 30 and the rail 10 is reduced.

Figure 5:
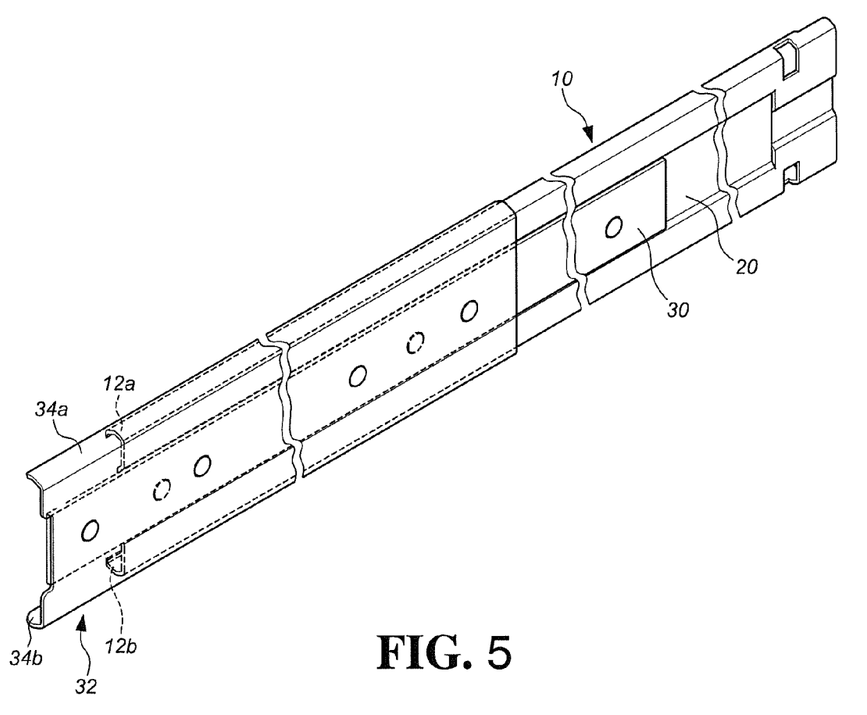
FIG. 5 is a perspective view to show that the reinforcement member is connected to the rail of the first embodiment of the present invention.

In another embodiment of the slide assembly is disclosed in FIG. 5 and the reinforcement member 30 is fixed to the reinforcement path 20 by rivets. The first flange 34a and the second flange 34b hold the top wall 12a and the bottom wall 12b of the rail 10.

Figure 6:
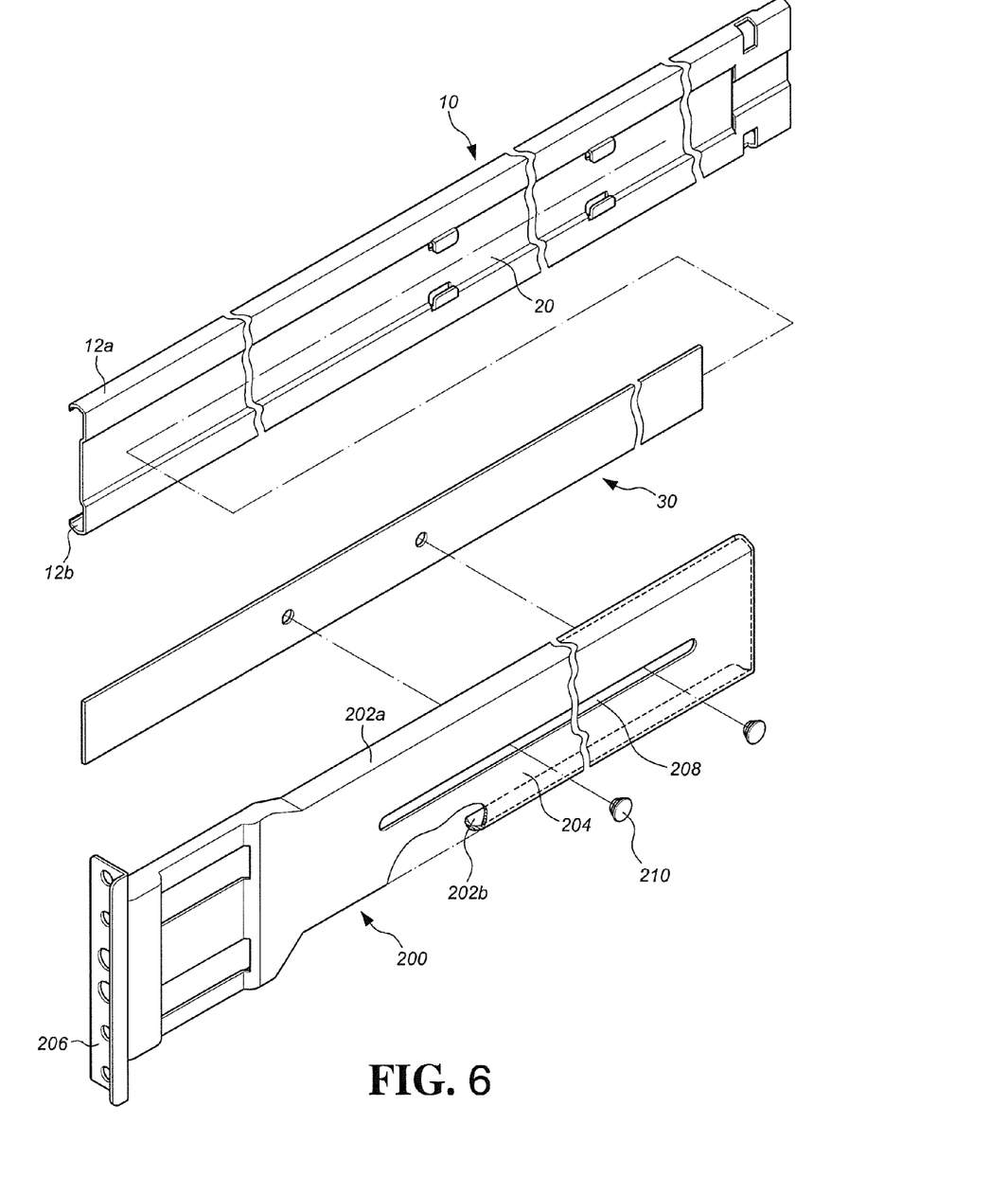
FIG. 6 is an exploded view to show the second embodiment of the reinforcement device of the present invention.
Figure 7:
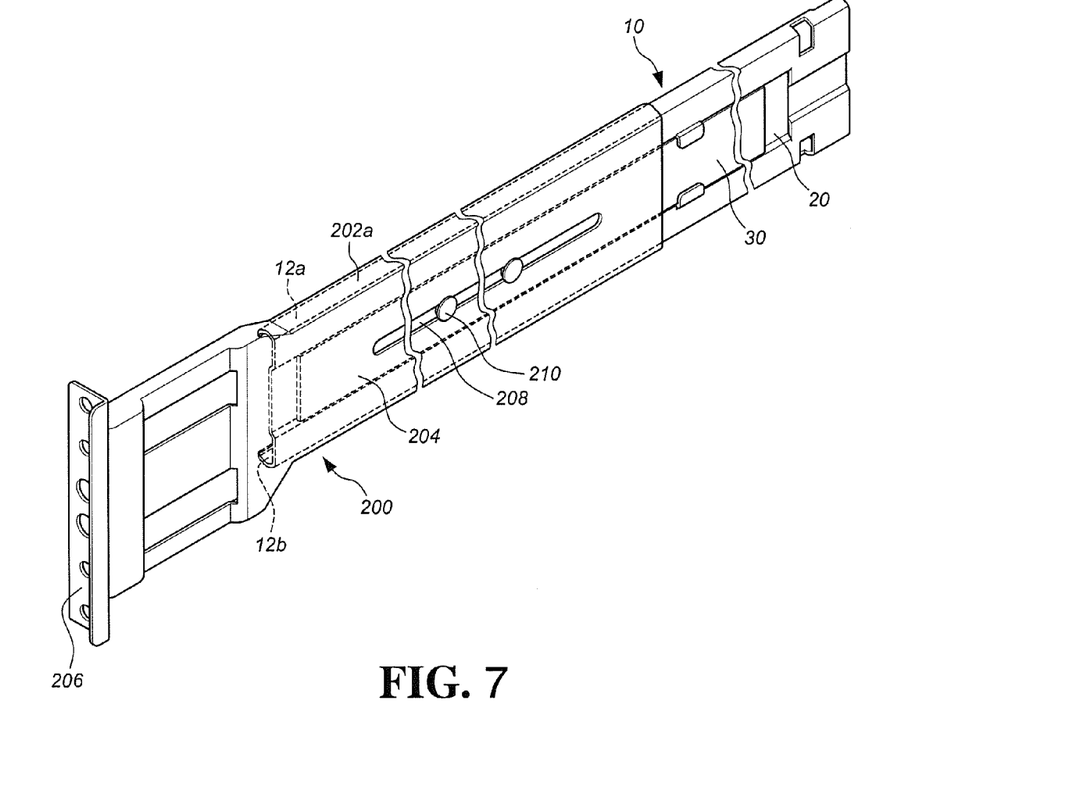
FIG. 7 is a perspective view to show that the reinforcement member and the extension support of the second embodiment are connected to the rail of the slide assembly.

As shown in FIGS. 6 and 7, the extension support 200 is movably connected to the reinforcement member 30 and comprises a first flange 202a, a second flange 202b located corresponding to the first flange 202a, and a second connection portion 204 connected between the first flange 202a and the second flange 202b. The first flange 202a, the second flange 202b and the second connection portion 204 define an arm. The first flange 202a and the second flange 202b hold the top wall 12a and the bottom wall 12b of the rail 10. Therefore, the extension support 200 is movable relative to the rail 10 and the reinforcement member 30. The extension support 200 has an installation portion 206 connected to an end thereof so as to be fixed to a post of a rack (not shown). The extension support 200 has a longitudinal slot 208 and at least one positioning member 210 which extends through the longitudinal slot 208 and is connected to the reinforcement member 30 so that the travel of the extension support 200 relative to the reinforcement member 30 is properly restricted. By this arrangement, the extension support 200 can be directly connected to racks of different sizes.

Figure 8:
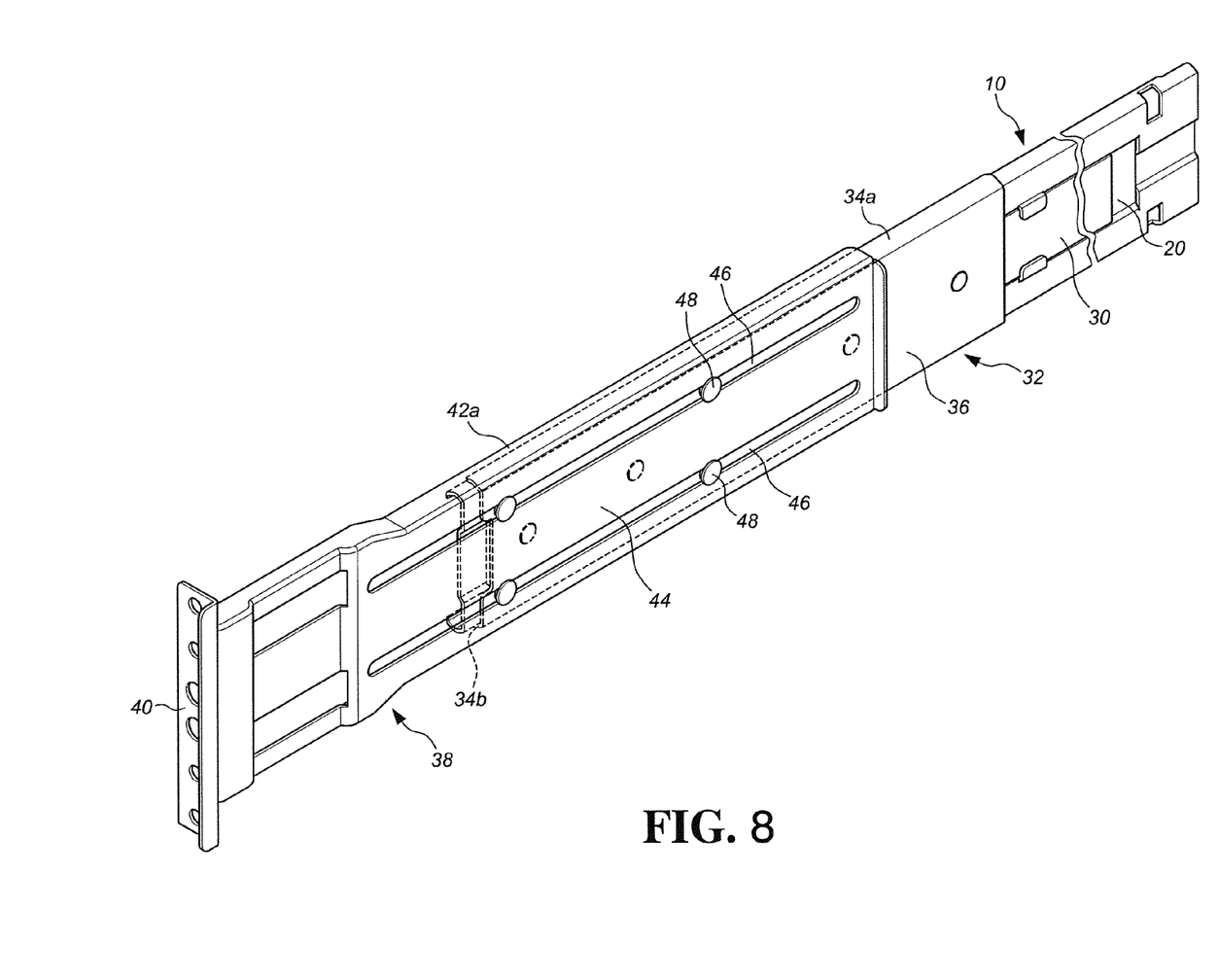
FIG. 8 shows that the first embodiment further has an installation support.
Figure 9:
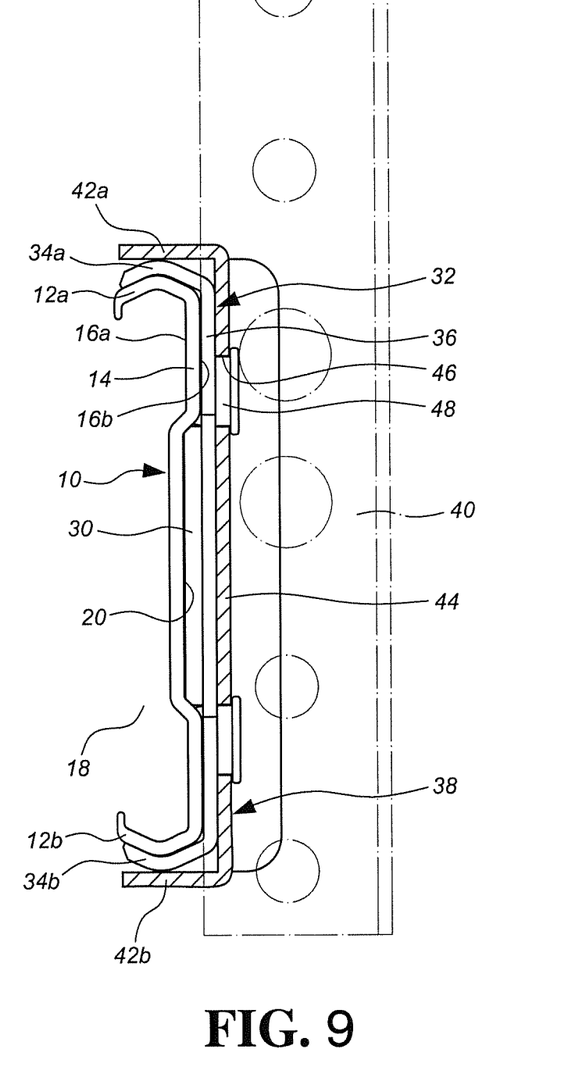
FIG. 9 shows the cross sectional view of that the first embodiment further has an installation support.

Referring to FIGS. 8 and 9, in the first embodiment, an installation support 38 is movably connected to the extension support 32 and has an installation portion 40 at an end thereof. The installation support 38 has a first support portion 42a, a second support portion 42b located corresponding to the first support portion 42a, and a second connection portion 44 connected between the first support portion 42a and the second support portion 42b. Preferably, the installation support 38 has two separated longitudinal slots 46 and at least two positioning members 48 which extend through the two longitudinal slots 46 and are connected to the extension support 32. The first support portion 42a contacts the first flange 34a, and the second support portion 42b contacts the second flange 34b. The installation support 38 is movable and adjustable along with the movement of the reinforcement member 30 and the extension support 32. Besides, the installation support 38 is movable relative to the extension support 32.

While we have shown and described the embodiment in accordance with the present invention, it should be clear to those skilled in the art that further embodiments may be made without departing from the scope of the present invention.

What is claimed is:
1. A reinforcement device comprising:
a rail having a top wall, a bottom wall located corresponding to the top wall, and a sidewall extending between the top wall and the bottom wall, the sidewall having a first face and a second face on opposing sides thereof, the top wall, the bottom wall, and the first face of the sidewall defining a slide path,
the sidewall configured to form upper and lower longitudinally extending offset-bend portions thereof to define an undulating cross-section of the rail, the undulating cross-section defining a recessed reinforcement path on the second face of the sidewall bounded by a first inner wall and a second inner wall respectively defined by the upper and lower offset-bend portions, and a connection wall extending between the first and second inner walls, the connection wall being recessed relative to a surrounding surface of the second face;
a planar reinforcement member having first and second surfaces on opposing sides thereof, the reinforcement member being slidably retained in the reinforcement path of the rail in recessed manner against the connection wall, the reinforcement member thereby substantially filling the reinforcement path, with the first surface bearing against the connection wall, and an extension support bearing against the second surface of the reinforcement member to capture the reinforcement member against the rail, the extension support having a first flange, a second flange, and a first connection portion extending between the first flange and the second flange, the first flange, the second flange and the first connection portion defining an arm, the first flange and the second flange respectively engaging in displaceable manner the top wall and the bottom wall of the rail, wherein top and lower protrusions are disposed on the rail intermediately between the top and bottom walls of the rail to retain the reinforcement member therein, the top protrusion extending from the second face located adjacent to the first inner wall, the top protrusion reaching into the reinforcement path, the lower protrusion extending from the second face located adjacent to the second inner wall, the lower protrusion reaching into the reinforcement path, the reinforcement member contacting the top and lower protrusions so that the reinforcement member remains movably connected to the reinforcement path of the rail.

2. The device as claimed in claim 1, wherein a thickness of the reinforcement member is the same as the depth of the reinforcement path.

3. The device as claimed in claim 1, wherein the extension support is fixed to the reinforcement member which is movably connected to the reinforcement path of the rail.

4. The device as claimed in claim 1, wherein the extension support is fixed to the reinforcement member which is fixed to the reinforcement path of the rail.

5. The device as claimed in claim 1, wherein the reinforcement member is fixed to the reinforcement path of the rail and the extension support is movably connected to the reinforcement member.

6. The device as claimed in claim 1, wherein the extension support has a longitudinal slot and at least one positioning member which extends through the longitudinal slot and is connected to the reinforcement member, the extension support has an installation portion connected to an end thereof.

7. The device as claimed in claim 1, wherein an installation support is movably connected to the extension support and has an installation portion at an end thereof, the installation support has a first support portion, a second support portion located corresponding to the first support portion, and a second connection portion connected between the first support portion and the second support portion, the first support portion contacts the first flange and the second support portion contacts the second flange, the second connection portion has two separated longitudinal slots and at least two positioning members which extend through the two longitudinal slots and are connected to the extension support.

* * * * *